United States Patent
Yang et al.

(10) Patent No.: US 9,831,472 B2
(45) Date of Patent: Nov. 28, 2017

(54) OLED DISPLAY ELEMENT AND ITS FABRICATING METHOD, DISPLAY PANEL AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jiuxia Yang, Beijing (CN); Feng Bai, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/105,535

(22) PCT Filed: Sep. 28, 2015

(86) PCT No.: PCT/CN2015/090907
§ 371 (c)(1),
(2) Date: Jun. 16, 2016

(87) PCT Pub. No.: WO2016/206212
PCT Pub. Date: Dec. 29, 2016

(65) Prior Publication Data
US 2017/0207424 A1    Jul. 20, 2017

(30) Foreign Application Priority Data
Jun. 24, 2015 (CN) .......................... 2015 1 0354557

(51) Int. Cl.
*H01L 21/00* (2006.01)
*H01L 51/56* (2006.01)
(Continued)

(52) U.S. Cl.
CPC .......... *H01L 51/56* (2013.01); *H01L 27/3211* (2013.01); *H01L 27/3244* (2013.01);
(Continued)

(58) Field of Classification Search
CPC .. H01L 51/56; H01L 51/5056; H01L 27/3244
(Continued)

(56) References Cited

U.S. PATENT DOCUMENTS

2008/0074043 A1* 3/2008 Kim .................... H01L 51/0014
                                                      313/504
2016/0172632 A1* 6/2016 Kwon .................. G02B 5/0247
                                                      257/40

FOREIGN PATENT DOCUMENTS

CN      101076452 A      11/2007
CN      101150141 A      3/2008
(Continued)

OTHER PUBLICATIONS

Office Action in Chinese Application No. 201510354557.X dated Oct. 10, 2016, with English translation. 6 pages.
(Continued)

*Primary Examiner* — David S Blum
(74) *Attorney, Agent, or Firm* — Blakely Sokoloff Taylor & Zafman LLP

(57) ABSTRACT

An OLED display element and its fabricating method, a display panel and a display device are disclosed. The method comprises steps of: preparing a base plate, wherein an anode layer and a hole injection layer are arranged on the base plate successively; forming a hole transport layer on the base plate; forming a first mask plate comprising a first pattern by nano-imprinting, wherein the first pattern is a material through hole; forming an organic light emitting layer on the base plate by means of the first mask plate; and forming an electron transport layer, an electron injection layer and a cathode layer on the base plate. The fabricated OLED
(Continued)

display element has a relatively small size and relatively high fineness. Thus, in case the OLED display element is applied to a display panel, the resolution of the display panel is increased.

20 Claims, 2 Drawing Sheets

(51) Int. Cl.
H01L 51/50 (2006.01)
H01L 51/00 (2006.01)
H01L 27/32 (2006.01)

(52) U.S. Cl.
CPC ...... H01L 51/0004 (2013.01); H01L 51/0026 (2013.01); H01L 51/5056 (2013.01); H01L 51/5072 (2013.01); H01L 51/5092 (2013.01); H01L 51/5096 (2013.01); H01L 2227/323 (2013.01)

(58) Field of Classification Search
USPC .......................................... 438/46
See application file for complete search history.

(56) References Cited

FOREIGN PATENT DOCUMENTS

| | | |
|---|---|---|
| CN | 101320209 A | 12/2008 |
| CN | 102470665 A | 5/2012 |
| CN | 102496685 A | 6/2012 |
| CN | 103451598 A | 12/2013 |
| CN | 104608513 A | 5/2015 |
| JP | 2006286245 A | 10/2006 |
| JP | 2013211383 A | 10/2013 |
| KR | 20140057970 A | 5/2014 |

OTHER PUBLICATIONS

Office Action in Chinese Application No. 201510354557.X dated Jan. 3, 2017, with English translation. 9 pages.
International Search Report and Written Opinion of the ISA in PCT/CN2015/090907. 14 pages.

\* cited by examiner

OLED DISPLAY ELEMENT AND ITS FABRICATING METHOD, DISPLAY PANEL AND DISPLAY DEVICE

RELATED APPLICATIONS

The present application is the U.S. national phase entry of PCT/CN2015/090907, with an international filing date of Sep. 28, 2015, which claims the benefit of Chinese Patent Application No. 201510354557.X, filed on Jun. 24, 2015, the entire disclosures of which are incorporated herein by reference.

FIELD OF THE INVENTION

The present disclosure relates to the field of display technique, and in particular to an OLED display element and its fabricating method, a display panel and a display device.

BACKGROUND ART

An OLED (Organic Light Emitting Diode) display element is a device in which organic semiconductor films are activated to emit light by a current. The OLED display element has a sandwich structure, and generally comprises an anode, a hole injection layer, a hole transport layer, an organic light emitting layer, an electron transport layer and a cathode. Under the effect of an external electric field, electrons and holes are respectively injected into the organic light emitting layer, and recombine in the light emitting layer to form excitons which radiate to emit light. The OLED display element has advantages like large contrast, high brightness, self-emitting, wide color gamut, light in weight and thin in profile, so that it has been considered as a promising generation of display technique.

An AMOLED (Active Matrix Organic Light Emitting Diode) display element is a kind of the OLED display element. As for a R/G/B type AMOLED display element, an AMOLED display element is a pixel unit comprising R/G/B sub-pixels. R/G/B sub-pixels of the AMOLED display element are formed by FMM (Fine Metal Shadow Mask) technology.

SUMMARY

Embodiments of the present disclosure provide an OLED display element and its fabricating method, a display panel and a display device, which solve the problem in which the AMOLED display element has a low fineness and the display panel has a low resolution.

In a first aspect, an embodiment of the present disclosure provides a method for fabricating an OLED display element. The OLED display element corresponds to a pixel unit. The method comprises steps of: preparing a base plate, wherein an anode layer and a hole injection layer are arranged on the base plate successively; forming a hole transport layer on the base plate; forming a first mask plate comprising a first pattern by nano-imprinting, wherein the first pattern is a material through hole; forming an organic light emitting layer on the base plate by means of the first mask plate; and forming an electron transport layer, an electron injection layer and a cathode layer on the base plate.

The first pattern of the first mask plate for fabricating the organic light emitting layer of the sub-pixel is formed by means of nano-imprinting process, so that the first pattern has a relatively small size and relatively high fineness. Accordingly, the organic light emitting layer with a high fineness is fabricated by utilizing the first pattern. The fabricated OLED display element has a relatively small size and relatively high fineness. Thus, in case the OLED display element is applied to a display panel, the resolution of the display panel is increased.

In an exemplary embodiment, the step of forming the hole transport layer on the base plate comprises: forming a second mask plate comprising a second pattern by nano-imprinting, wherein the second pattern is a material through hole and is identical to the first pattern; and forming the hole transport layer on the base plate by means of the second mask plate.

Both the first pattern of the first mask plate for fabricating the organic light emitting layer and the second pattern of the second mask plate for fabricating the hole transport layer are made by a nano-imprinting process, so that the first pattern and the second pattern have a relatively small size and relatively high fineness. Accordingly, the hole transport layer and the organic light emitting layer with high fineness are fabricated by utilizing the first pattern and second pattern. The fabricated OLED display element has a size and fineness which is more close to that of the first pattern and second pattern. Thus, in case the OLED display element is applied to a display panel, the resolution of the display panel is further increased.

In an exemplary embodiment, after forming the hole transport layer and prior to forming the organic light emitting layer, the method further comprises: forming a third mask plate comprising a third pattern by nano-imprinting, wherein the third pattern is a material through hole and is identical to the first pattern; and forming an electron blocking layer on the base plate by means of the third mask plate.

The first pattern of the first mask plate for fabricating the organic light emitting layer, the second pattern of the second mask plate for fabricating the hole transport layer, and the third pattern of the third mask plate for fabricating the electron blocking layer are made by a nano-imprinting process, so that the first pattern, the second pattern and the third pattern have a relatively small size and relatively high fineness. Accordingly, the hole transport layer, organic light emitting layer and electron transport layer with high fineness are fabricated by utilizing the first pattern, the second and the third pattern by means of the printing or transferring process. The fabricated OLED display element has a size and fineness which is more close to that of the first pattern, the second and the third pattern. Thus, in case the OLED display element is applied to a display panel, the resolution of the display panel is further increased. In an exemplary embodiment, the hole transport layer, the electron blocking layer and the organic light emitting layer are formed on the base plate by printing, transferring and coating.

By means of printing, transferring and coating, and by means of the first mask plate, the second mask plate and the third mask plate, the hole transport layer, the electron blocking layer and the organic light emitting layer formed in the OLED display element have a relatively small size and relatively high fineness.

In an exemplary embodiment, the step of forming the organic light emitting layer on the base plate comprise: aligning the first mask plate with respect to the base plate, fixing the first mask plate to the base plate by vacuum pressing; and carrying a precursor solution for the organic light emitting layer with a roller, and applying the precursor solution from the roller to the base plate in a rolling manner by means of the first pattern of the first mask plate.

In an exemplary embodiment, after applying the precursor solution from the roller to the base plate in the rolling manner, the method further comprises: unloading vacuum and removing the first mask plate, drying and curing the base plate on which the precursor solution has been formed, so that the precursor solution is dried to form the organic light emitting layer.

In an exemplary embodiment, the step of forming the hole transport layer on the base plate comprises: aligning the second mask plate with respect to the base plate, and fixing the second mask plate to the base plate by vacuum pressing; carrying the precursor solution with a roller, and applying the precursor solution from the roller to the base plate in a rolling manner by means of the second pattern of the second mask plate.

In an exemplary embodiment, after applying the precursor solution for the hole transport layer from the roller to the base plate in the rolling manner, the method further comprises: unloading vacuum and removing the second mask plate, drying and curing the base plate on which the precursor solution has been formed, so that the precursor solution is dried to form the hole transport layer.

In an exemplary embodiment, the step of forming the electron blocking layer on the base plate comprises: aligning the third mask plate with respect to the base plate, and fixing the third mask plate to the base plate by vacuum pressing; carrying a precursor solution for the electron blocking layer with a roller, and applying the precursor solution from the roller to the base plate in a rolling manner by means of the third pattern of the third mask plate.

In an exemplary embodiment, after applying the precursor solution from the roller to the base plate in the rolling manner, the method further comprises: unloading vacuum and removing the third mask plate, drying and curing the base plate on which the precursor solution has been formed, so that the precursor solution is dried to form the electron blocking layer.

In an exemplary embodiment, the drying and curing is performed by a hot plate or an oven, and the drying and curing is performed at a temperature of 60-80° C. for 30-90 seconds. The OLED display element is sensitive to temperature. The drying and curing is performed at a temperature of 60-80° C. for 30-90 seconds. In this way, it is possible to prevent functional layers in the OLED display element from exposure to high temperature which otherwise would lead to degradation in performance, and to improve the lifetime of the OLED display element.

In an exemplary embodiment, precursor solutions for the hole transport layer, the electron blocking layer and the organic light emitting layer are prepared in a vacuum environment.

The OLED display element is sensitive to water and moisture. The presence of water and moisture would decrease the lifetime of the OLED display element. By preparing precursor solutions for functional layers in a vacuum environment, water and moisture are isolated effectively, thus improving the lifetime of the OLED display element.

In an exemplary embodiment, the first mask plate, the second mask plate and the third mask plate may are made from nickel, titanium or a nickel-titanium alloy.

Nickel, titanium and a nickel-titanium alloy has small deformation and high strength, which facilitates fabricating the mask plate. Furthermore, the fabricated mask plate has advantages of small deformation and high strength, thus facilitating fabrication of a pixel pattern with a small size and high fineness.

In a second aspect, an embodiment of the present disclosure provides an OLED display element, which is fabricated by the method in the above-mentioned embodiments.

In a third aspect, an embodiment of the present disclosure provides a display panel, which comprises the OLED display element of the above-mentioned embodiments.

In a fourth aspect, an embodiment of the present disclosure provides a display device, which comprises the display panel of the above-mentioned embodiments.

The OLED display element, the display panel and the display device in the present disclosure have the same or similar beneficial effects as the above method for fabricating an OLED display element, which are not repeated herein for simplicity.

The first pattern of the first mask plate for fabricating the organic light emitting layer of the sub-pixel is formed by means of nano-imprinting process, so that the first pattern has a relatively small size and relatively high fineness. Accordingly, the organic light emitting layer with a high fineness is fabricated by utilizing the first pattern. The fabricated OLED display element has a relatively small size and relatively high fineness. Thus, in case the OLED display element is applied to a display panel, the resolution of the display panel is increased.

DETAILED DESCRIPTION OF EMBODIMENTS

The specific embodiments of this disclosure shall be explained in details as follows with reference to the drawings. The drawings of this disclosure schematically illustrate structures, portions and/or steps related to the inventive concepts, but do not illustrate or only partially illustrate structures, portions and/or steps unrelated to the inventive concepts.

However, a more fine FMM is currently not available. Therefore, the AMOLED display element fabricated by the FMM technology has a low fineness, so that the display panel comprising the AMOLED display element fabricated by the FMM technology has a low resolution. Thus, there is a need for improving the resolution of the display panel in the art.

Figure 1:
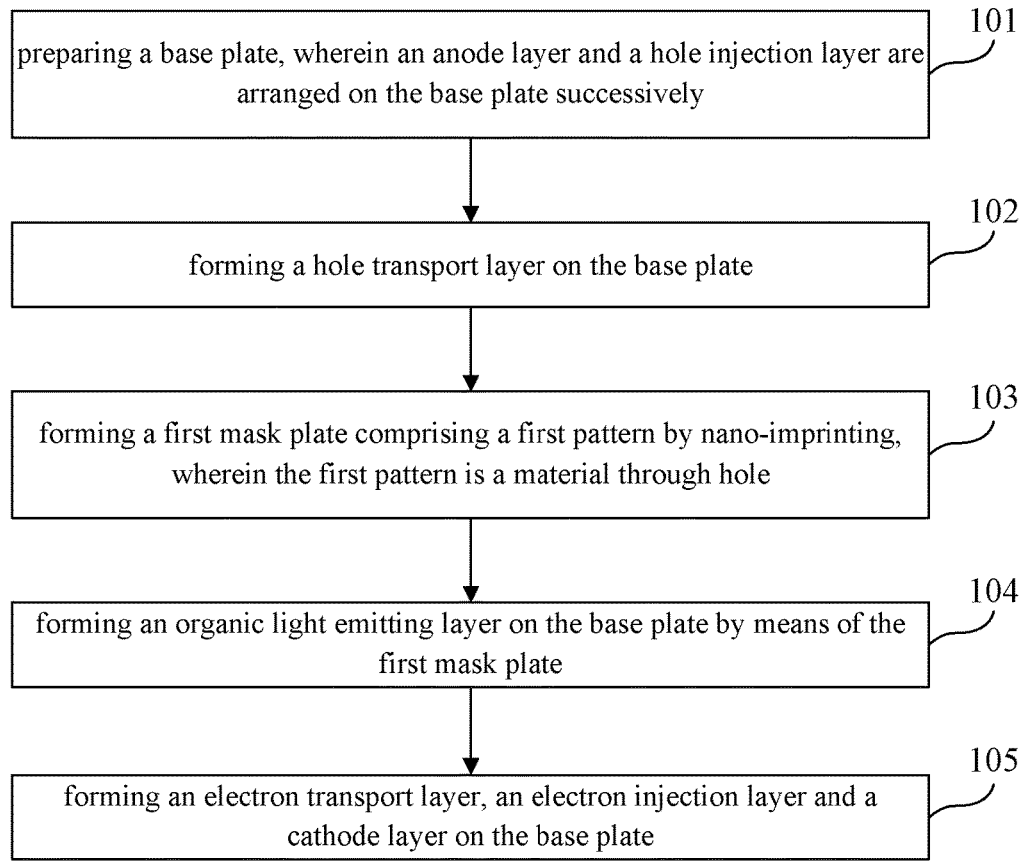
FIG. 1 is a flow chart illustrating a method for fabricating an OLED display element in an embodiment of the present disclosure.

As shown in FIG. 1, in an embodiment of the present disclosure, a method for fabricating an OLED display element is disclosed. The OLED display element corresponds to a pixel unit. The method comprises the following steps.

101, preparing a base plate, wherein an anode layer and a hole injection layer are arranged on the base plate successively.

102, forming a hole transport layer on the base plate.

103, forming a first mask plate comprising a first pattern by nano-imprinting, wherein the first pattern is a material through hole. In particular, a first pattern is formed in a metal plate by a nano-imprinting process, and the metal plate is used as a first mask plate. The first pattern is a printing or transferring material through hole. The first pattern is used for fabricating an organic light emitting layer corresponding to a sub-pixel of the pixel unit.

In an exemplary embodiment, the first mask plate is fabricated from nickel, titanium or a nickel-titanium alloy, so that it has advantages of small deformation and high strength. By forming a printing or transferring material through hole as the first pattern via nano-imprinting technology, it is possible to form fine pores, which facilitate realizing a relatively high fineness, and thus improving accuracy for fabricating the OLED display element.

104, forming an organic light emitting layer on the base plate by means of the first mask plate. In particular, after the first mask plate is aligned with respect to the base plate, the first mask plate is fixed to the base plate by vacuum pressing. The precursor solution for the organic light emitting layer is carried with a roller. The first mask plate is used as a printing or transferring mask plate. The precursor solution for the organic light emitting layer is applied from the roller to the base plate in a rolling manner.

It is noted that the first pattern in different first mask plates may correspond to different sub-pixels, e.g., to a R sub-pixel, a G sub-pixel, or a B sub-pixel. As a result, in step 104, printing is performed for several times with respect to different sub-pixels. For example, printing is performed for one time (i.e., once) with respect to the organic light emitting layer corresponding to the R sub-pixel, for one time with respect to the organic light emitting layer corresponding to the G sub-pixel, and for one time with respect to the organic light emitting layer corresponding to the B sub-pixel. In addition, R, G, B stands for red, green, blue, respectively.

In an embodiment, the organic light emitting layers corresponding to different sub-pixels are formed for one time by the transferring process. In other embodiments, the organic light emitting layers corresponding to different sub-pixels are formed for several times by the transferring process.

In an exemplary embodiment, after applying the precursor solution for the organic light emitting layer from the roller to the base plate in the rolling manner, the method further comprises:

unloading vacuum and removing the first mask plate, drying and curing the base plate on which the precursor solution for the organic light emitting layer has been printed or transferred, so that the precursor solution for the organic light emitting layer is dried to form the organic light emitting layer.

105, forming an electron transport layer, an electron injection layer and a cathode layer on the base plate from the above-mentioned step, thus completing fabrication of the OLED display element.

In the present embodiment, the first pattern of the first mask plate for fabricating the organic light emitting layer of the sub-pixel is made by a nano-imprinting process, so that the first pattern has a relatively small size and relatively high fineness. Accordingly, the organic light emitting layer with high fineness is fabricated by utilizing the first pattern. The fabricated OLED display element has a relatively small size and relatively high fineness. In case the OLED display element is applied to a display panel, the resolution of the display panel is increased.

In an exemplary embodiment, the hole transport layer of the OLED display element is also fabricated by the fine mask plate formed by nano-imprinting. For example, a second mask plate comprising a second pattern is formed by nano-imprinting, and the second pattern is a material through hole. In particular, a second pattern is formed in a metal plate by a nano-imprinting process, and the metal plate is used as a second mask plate. The second pattern is a printing or transferring material through hole. The second pattern is used for fabricating the hole transport layer corresponding to a sub-pixel of the pixel unit.

In an exemplary embodiment, the second mask plate is fabricated from nickel, titanium or a nickel-titanium alloy, so that it has advantages of small deformation and high strength. By forming a printing or transferring material through hole as the second pattern via nano-imprinting technology, it is possible to form fine pores, which facilitate realizing a relatively high fineness, and thus improving accuracy for fabricating the OLED display element.

The step of forming the hole transport layer on the base plate by printing or transferring by means of the second mask plate comprises: aligning the second mask plate with respect to the base plate, and fixing the second mask plate to the base plate by vacuum pressing; carrying a precursor solution for the hole transport layer with a roller, and applying the precursor solution for the hole transport layer from the roller to the base plate in a rolling manner by means of the second pattern of the second mask plate.

It is noted that the second pattern in different second mask plates may correspond to different sub-pixels, e.g., to a R sub-pixel, a G sub-pixel, or a B sub-pixel. As a result, in step 104, printing is performed for several times with respect to different sub-pixels. For example, printing is performed for one time with respect to the organic light emitting layer corresponding to the R sub-pixel, for one time with respect to the organic light emitting layer corresponding to the G sub-pixel, and for one time with respect to the organic light emitting layer corresponding to the B sub-pixel. In an embodiment, the organic light emitting layers corresponding to different sub-pixels is formed for one time by the transferring process. In other embodiments, the organic light emitting layers corresponding to different sub-pixels is formed for several times by the transferring process.

In an exemplary embodiment, after applying the precursor solution for the hole transport layer from the roller to the base plate in the rolling manner, the method further comprises: unloading vacuum and removing the second mask plate, drying and curing the base plate on which the precursor solution for the hole transport layer has been printed or transferred, so that the precursor solution for the hole transport layer is dried to form the hole transport layer.

In the present embodiment, both the first pattern for fabricating the organic light emitting layer and the second pattern for fabricating the hole transport layer are made by a nano-imprinting process, so that the first pattern and the second pattern have a relatively small size and relatively high fineness. Accordingly, the hole transport layer and the organic light emitting layer with high fineness is fabricated by utilizing the first pattern and second pattern by means of the printing or transferring process. The fabricated OLED display element has a size and fineness which is more close to that of the first pattern and second pattern. Thus, in case the OLED display element is applied to a display panel, the resolution of the display panel is further increased.

In an exemplary embodiment, the OLED display element further comprises an electron blocking layer, which is also fabricated by the fine mask plate formed by nano-imprinting. For example, a third mask plate comprising a third pattern is formed by nano-imprinting, wherein the third pattern is a material through hole. In particular, a third pattern is formed in a metal plate by a nano-imprinting process, and the metal plate is used as a third mask plate. The third pattern is a printing or transferring material through hole. The third pattern is used for fabricating the electron blocking layer corresponding to a sub-pixel of the pixel unit.

In an exemplary embodiment, the third mask plate is fabricated from nickel, titanium or a nickel-titanium alloy, so that it has advantages of small deformation and high strength. By forming a printing or transferring material through hole as the third pattern via nano-imprinting technology, it is possible to form fine pores, which facilitate realizing a relatively high fineness, and thus improving accuracy for fabricating the OLED display element.

The step of forming the electron blocking layer on the base plate by printing or transferring by means of the third mask plate comprises: aligning the third mask plate with respect to the base plate, and fixing the third mask plate to the base plate by vacuum pressing; carrying a precursor solution for the electron blocking layer with a roller, and applying the precursor solution for the electron blocking layer from the roller to the base plate in a rolling manner by means of the second pattern of the third mask plate.

It is noted that the third pattern in different third mask plates may correspond to different sub-pixels, e.g., to a R sub-pixel, a G sub-pixel, or a B sub-pixel. As a result, in step 104, printing is performed for several times with respect to different sub-pixels. For example, printing is performed for one time with respect to the electron blocking layer corresponding to the R sub-pixel, for one time with respect to the electron blocking layer corresponding to the G sub-pixel, and for one time with respect to the electron blocking layer corresponding to the B sub-pixel. In an embodiment, the electron blocking layers corresponding to different sub-pixels is formed for one time by the transferring process. In other embodiments, the electron blocking layers corresponding to different sub-pixels is formed for several times by the transferring process.

In an exemplary embodiment, after applying the precursor solution for the electron blocking layer from the roller to the base plate in the rolling manner, the method further comprises:

unloading vacuum and removing the third mask plate, drying and curing the base plate on which the precursor solution for the electron blocking layer has been printed or transferred, so that the precursor solution for the electron blocking layer is dried to form the electron blocking layer.

In the present embodiment, the first pattern of the first mask plate for fabricating the organic light emitting layer, the second pattern of the second mask plate for fabricating the hole transport layer, and the third pattern of the third mask plate for fabricating the electron blocking layer are made by a nano-imprinting process, so that the first pattern, the second pattern and the third pattern have a relatively small size and relatively high fineness. Accordingly, the hole transport layer, organic light emitting layer and electron transport layer with high fineness are fabricated by utilizing the first pattern, the second and the third pattern by means of the printing or transferring process. The fabricated OLED display element has a size and fineness which is more close to that of the first pattern, the second and the third pattern. Thus, in case the OLED display element is applied to a display panel, the resolution of the display panel is further increased.

In the above-mentioned embodiment, the hole transport layer, the organic light emitting layer and the electron blocking layer are respectively formed on the base plate by printing and transferring. However, the present disclosure is not limited to this. For example, in an exemplary embodiment, the hole transport layer, the organic light emitting layer and the electron blocking layer are formed respectively on the base plate by coating.

In an exemplary embodiment, in the step of forming the organic light emitting layer, the hole transport layer and the electron blocking layer by means of the first mask plate, the second mask plate and the third mask plate, the drying and curing is performed by a hot plate or an oven, and the drying and curing is performed at a temperature of 60-80° C. for 30-90 seconds.

In an exemplary embodiment, forming the organic light emitting layer on the base plate by printing or transferring by means of the first mask plate further comprises preparing the precursor solution for the organic light emitting layer in a vacuum environment. Before forming the hole transport layer on the base plate by printing or transferring by means of the second mask plate, the method further comprises preparing the precursor solution for the hole transport layer in a vacuum environment. Before forming the electron blocking layer on the base plate by printing or transferring by means of the third mask plate, the method further comprises preparing the precursor solution for the electron blocking layer in a vacuum environment. By preparing precursor solutions for functional layers in the vacuum environment, it is possible to isolate water and moisture effectively, and thus improve the lifetime of the OLED display element.

The first pattern of the first mask plate for fabricating the organic light emitting layer of the sub-pixel is formed by means of nano-imprinting process, so that the first pattern has a relatively small size and relatively high fineness. Accordingly, the organic light emitting layer with a high fineness is fabricated by utilizing the first pattern. The fabricated OLED display element has a relatively small size and relatively high fineness. Thus, in case the OLED display element is applied to a display panel, the resolution of the display panel is increased.

An embodiment of the present disclosure further provides an OLED display element which is fabricated by the method in the above-mentioned embodiments. In the present disclosure, the OELD display element comprises such components as a base plate, an anode layer, a hole injection layer, a hole transport layer, an organic light emitting layer, an electron transport layer, an electron injection layer and a cathode layer. It is noted that, during printing the hole transport layer and the organic light emitting layer, at places corresponding to different sub-pixels of the OLED display element, the hole transport layer and the organic light emitting layer to which different sub-pixels correspond have a same thickness in an embodiment, and different thicknesses in other embodiments. The structure of the OLED display element is explained as follow in an example.

Figure 2:
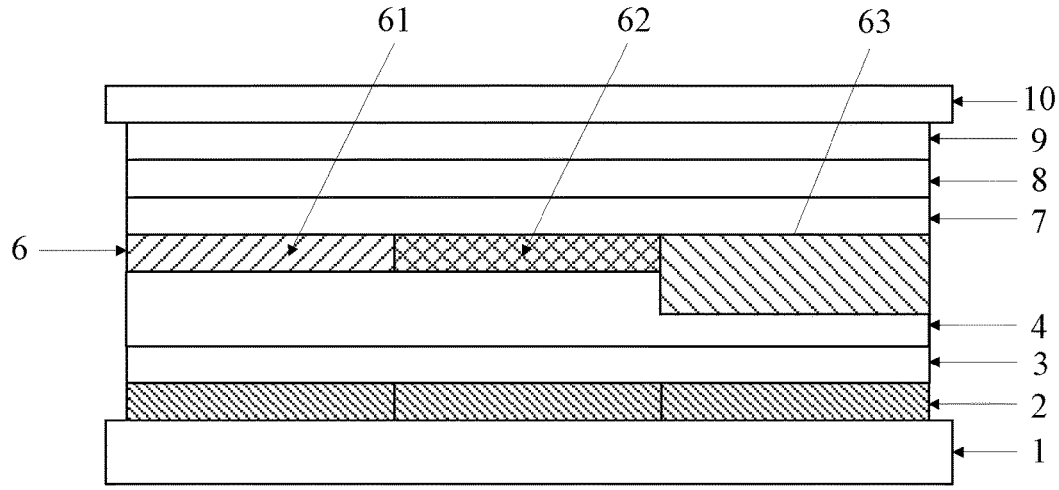
FIG. 2 is a structural view illustrating a first OLED display element in an embodiment of the present disclosure.

For example, a structural view for a first OLED display element is shown in FIG. 2. The OLED display element comprises a base plate 1, an anode layer 2, a hole injection layer 3, a hole transport layer 4, an organic light emitting layer 6, an electron transport layer 7, an electron injection layer 8 and a cathode layer 9. The organic light emitting layer 6 corresponds to sub-pixels of different colors, comprises an organic light emitting sub-layer 61, an organic light emitting sub-layer 62 and an organic light emitting sub-layer 63, and corresponds to sub-pixels of R, G and B color, respectively. It is apparent that the organic light emitting layer 61, the organic light emitting sub-layer 62 and the organic light emitting sub-layer 63 have different thicknesses at places corresponding to different sub-pixels. Accordingly, the hole transport layer 4 has different thicknesses at places corresponding to different sub-pixels.

Figure 3:
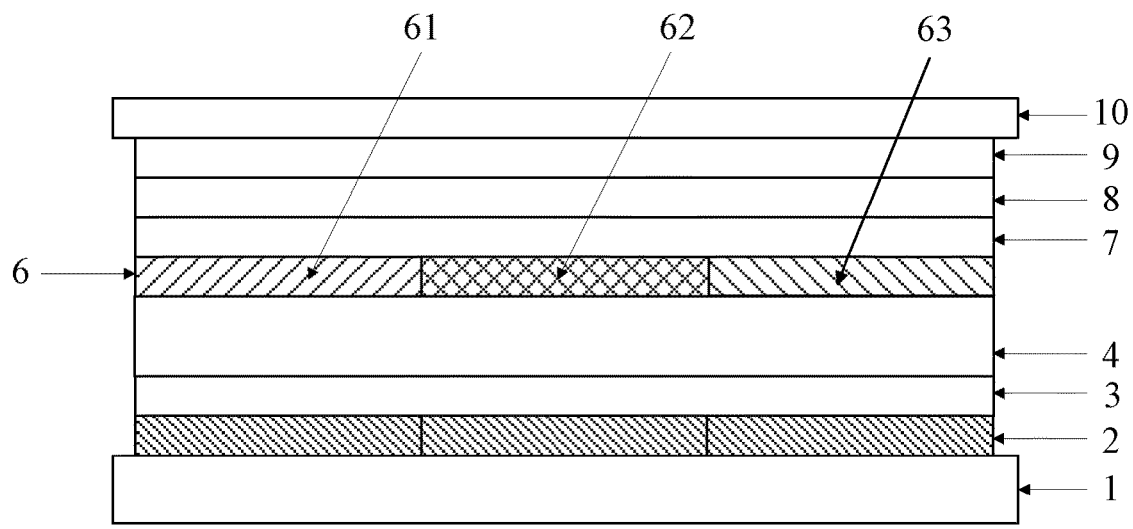
FIG. 3 is a structural view illustrating a second OLED display element in an embodiment of the present disclosure.

For example, a structural view of a second OLED display element is shown in FIG. 3. The OLED display element comprises a base plate 1, an anode layer 2, a hole injection layer 3, a hole transport layer 4, an organic light emitting layer 6, an electron transport layer 7, an electron injection layer 8 and a cathode layer 9. The organic light emitting layer 6 corresponds to sub-pixels of different colors, comprises an organic light emitting sub-layer 61, an organic light emitting sub-layer 62 and an organic light emitting sub-layer 63, and corresponds to sub-pixels of R, G and B color, respectively. It is apparent that the organic light emitting layer 61, the organic light emitting sub-layer 62 and the organic light emitting sub-layer 63 have the same thickness at places corresponding to different sub-pixels. Accordingly, the hole transport layer 4 has the same thickness at places corresponding to different sub-pixels.

It is noted that in the OLED display element shown in FIG. 2 and FIG. 3, a cover plate 10 is further arranged over the cathode layer 9, and an electron blocking layer (not shown) is further arranged between the hole transport layer 4 and the organic light emitting layer 6. Furthermore, the OLED display elements in FIG. 2 and FIG. 3 are provided merely for purpose of illustration, the present disclosure is by no means limited thereto.

An embodiment of the present disclosure further provides a display panel, which comprises the OLED display element in the above embodiments.

The first pattern for fabricating the hole transport layer of the sub-pixel and the second pattern for fabricating the organic light emitting layer of the sub-pixel are formed by means of nano-imprinting process have a relatively high fineness. Accordingly, the hole transport layer and the organic light emitting layer with a high fineness are fabricated by utilizing the first pattern and second pattern by means of the printing or transferring process. Thus, in case the OLED display element is applied to a display panel and a display device, the resolution of the display panel and the display device is increased.

An embodiment of the present disclosure further provides a display device, which comprises the display panel in the above embodiments.

The first pattern for fabricating the hole transport layer of the sub-pixel and the second pattern for fabricating the organic light emitting layer of the sub-pixel are formed by means of nano-imprinting process have a relatively high fineness. Accordingly, the hole transport layer and the organic light emitting layer with a high fineness are fabricated by utilizing the first pattern and second pattern by means of the printing or transferring process. Thus, in case the OLED display element is applied to a display panel and a display device, the resolution of the display panel and the display device is increased.

The above description of the embodiments of this disclosure is provided only for illustrative and explanatory purposes, and it is not intended to be exhaustive or to limit the content of this disclosure. Therefore, the skilled person in the art will easily conceive of many modifications and transformations. In particular, the scope of this disclosure shall be defined by the claims attached.

What is claimed is:

1. A method for fabricating an OLED display element, the OLED display element corresponding to a pixel unit, the method comprising steps of:
    preparing a base plate, wherein an anode layer and a hole injection layer are arranged on the base plate successively;
    forming a hole transport layer on the base plate;
    forming a first mask plate comprising a first pattern by nano-imprinting, wherein the first pattern is a material through hole and the first mask plate is made from nickel, titanium or a nickel-titanium alloy;
    forming an organic light emitting layer on the base plate by means of the first mask plate; and
    forming an electron transport layer, an electron injection layer and a cathode layer on the base plate.

2. The method of claim 1, wherein the step of forming the hole transport layer on the base plate comprises:
    forming a second mask plate comprising a second pattern by nano-imprinting, wherein the second pattern is a material through hole and is identical to the first pattern; and
    forming the hole transport layer on the base plate by means of the second mask plate.

3. The method of claim 2, wherein after forming the hole transport layer and prior to forming the organic light emitting layer, the method further comprises:
    forming a third mask plate comprising a third pattern by nano-imprinting, wherein the third pattern is a material through hole and is identical to the first pattern; and
    forming an electron blocking layer on the base plate by means of the third mask plate.

4. The method of claim 3, wherein forming the hole transport layer, the electron blocking layer and the organic light emitting layer on the base plate by printing, transferring and coating.

5. The method of claim 4, wherein the step of forming the organic light emitting layer on the base plate comprises:
    aligning the first mask plate with respect to the base plate, and fixing the first mask plate to the base plate by vacuum pressing;
    carrying a precursor solution for the organic light emitting layer with a roller, and applying the precursor solution from the roller to the base plate in a rolling manner by means of the first pattern of the first mask plate.

6. The method of claim 5, wherein after applying the precursor solution from the roller to the base plate in the rolling manner, the method further comprises:
    unloading vacuum and removing the first mask plate, drying and curing the base plate on which the precursor solution has been formed, so that the precursor solution is dried to form the organic light emitting layer.

7. The method of claim 4, wherein the step of forming the hole transport layer on the base plate comprises:
    aligning the second mask plate with respect to the base plate, and fixing the second mask plate to the base plate by vacuum pressing;
    carrying a precursor solution for the hole transport layer with a roller, and applying the precursor solution from the roller to the base plate in a rolling manner by means of the second pattern of the second mask plate.

8. The method of claim 7, wherein after applying the precursor solution from the roller to the base plate in the rolling manner, the method further comprises:
    unloading vacuum and removing the second mask plate, drying and curing the base plate on which the precursor solution has been formed, so that the precursor solution is dried to form the hole transport layer.

9. The method of claim 4, wherein the step of forming the electron blocking layer on the base plate comprises:
    aligning the third mask plate with respect to the base plate, and fixing the third mask plate to the base plate by vacuum pressing;
    carrying a precursor solution for the electron blocking layer with a roller, and applying the precursor solution from the roller to the base plate in a rolling manner by means of the third pattern of the third mask plate.

10. The method of claim 9, wherein after applying the precursor solution from the roller to the base plate in the rolling manner, the method further comprises:
  unloading vacuum and removing the third mask plate, drying and curing the base plate on which the precursor solution has been formed, so that the precursor solution is dried to form the electron blocking layer.

11. The method of claim 6, wherein the drying and curing is performed by a hot plate or an oven, and the drying and curing is performed at a temperature of 60-80° C. for 30-90 seconds.

12. The method of claim 5, wherein the precursor solution is prepared in a vacuum environment.

13. The method of claim 3, wherein the first mask plate, the second mask plate and the third mask plate are made from nickel, titanium or a nickel-titanium alloy.

14. An OLED display element, being fabricated by the method of claim 1.

15. A display panel, comprising the OLED display element of claim 14.

16. A display device, comprising the display panel of claim 15.

17. The method of claim 8, wherein the drying and curing is performed by a hot plate or an oven, and the drying and curing is performed at a temperature of 60-80° C. for 30-90 seconds.

18. The method of claim 10, wherein the drying and curing is performed by a hot plate or an oven, and the drying and curing is performed at a temperature of 60-80° C. for 30-90 seconds.

19. The method of claim 7, wherein the precursor solution is prepared in a vacuum environment.

20. The method of claim 9, wherein the precursor solution is prepared in a vacuum environment.

* * * * *